United States Patent
Jang et al.

(10) Patent No.: US 9,883,619 B2
(45) Date of Patent: Jan. 30, 2018

(54) SHIELDING APPARATUS

(71) Applicant: Samsung Electronics Co., Ltd., Suwon-si, Gyeonggi-do (KR)

(72) Inventors: Souk-Su Jang, Gumi-si (KR); Hyun-Suk Choi, Daegu (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 271 days.

(21) Appl. No.: 14/306,540

(22) Filed: Jun. 17, 2014

(65) Prior Publication Data

US 2015/0014049 A1 Jan. 15, 2015

(30) Foreign Application Priority Data

Jul. 11, 2013 (KR) ........................ 10-2013-0081557

(51) Int. Cl.
*H05K 7/20* (2006.01)
*H05K 9/00* (2006.01)

(52) U.S. Cl.
CPC ......... *H05K 9/0024* (2013.01); *H05K 9/0028* (2013.01); *H05K 2201/0707* (2013.01)

(58) Field of Classification Search
USPC ................................ 361/816, 818; 174/377
See application file for complete search history.

(56) References Cited

U.S. PATENT DOCUMENTS

| 6,687,135 | B1 | 2/2004 | Kitade | |
| 7,429,192 | B2* | 9/2008 | Liao | H01R 13/6594 439/567 |
| 2003/0107881 | A1* | 6/2003 | Muramatsu | H01Q 1/1207 361/818 |
| 2011/0299262 | A1 | 12/2011 | Crotty | |

FOREIGN PATENT DOCUMENTS

| EP | 1445999 A1 | 8/2004 |
| EP | 2546996 A2 | 1/2013 |
| EP | 2605629 A2 | 6/2013 |
| KR | 10-2009-0104611 A | 10/2009 |
| KR | 10-2010-0126879 A | 12/2010 |

* cited by examiner

*Primary Examiner* — Andargie M Aychillhum
(74) *Attorney, Agent, or Firm* — Jefferson IP Law, LLP (57) ABSTRACT

A shielding apparatus is provided. The apparatus includes a printed circuit board including a plurality of catching parts, a shield member configured to cover the printed circuit board, and at least one shield fastening part provided in the shield member and configured to be one of fastened to and separated from the plurality of catching parts by a resilient force while not protruding.

21 Claims, 11 Drawing Sheets

SHIELDING APPARATUS

CROSS-REFERENCE TO RELATED APPLICATION(S)

This application claims the benefit under 35 U.S.C. §119 (a) of a Korean patent application filed on Jul. 11, 2013 in the Korean Intellectual Property Office and assigned Serial No. 10-2013-0081557, the entire disclosure of which is hereby incorporated by reference.

TECHNICAL FIELD

The present disclosure relates to a shielding apparatus provided in an electronic device. More particularly, the present disclosure relates to a shielding apparatus which allows a shield member to be fastened or released.

BACKGROUND

In general, while electronic waves may be usefully utilized in wireless communications or radars, they may negatively influence operations of electronic devices; a phenomenon which is referred to as the Electro-Magnetic Interference (EMI) phenomenon. The electro-magnetic interference phenomenon generates noise in electronic devices and acts as a harmful element to human bodies.

Thus, in recent technology, an electro-magnetic interference phenomenon generated in electronic components installed on a printed circuit board provided within an electric device is interrupted by covering the electronic components with a shield member (e.g., a shield part or a shield can), so that it cannot influence operations of the electronic devices as well as other electronic devices. The shield member has a box shape at a lower end which is opened to cover an electronic component.

Further, the shield member is fixedly installed on a printed circuit board by a screw and a clip provided to couple or fasten a side wall of the shield member while the shield member is located on the printed circuit board.

Figure 1:
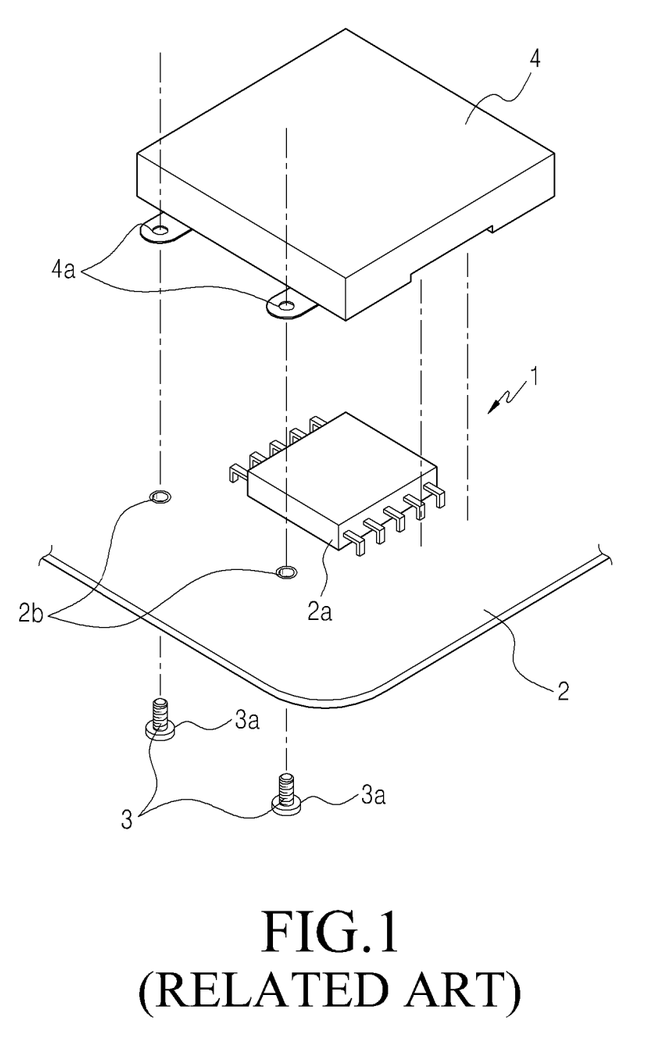
FIG. 1 is an exploded perspective view showing a configuration of a shielding apparatus employing a screw fastening structure according to the related art.
Figure 2:
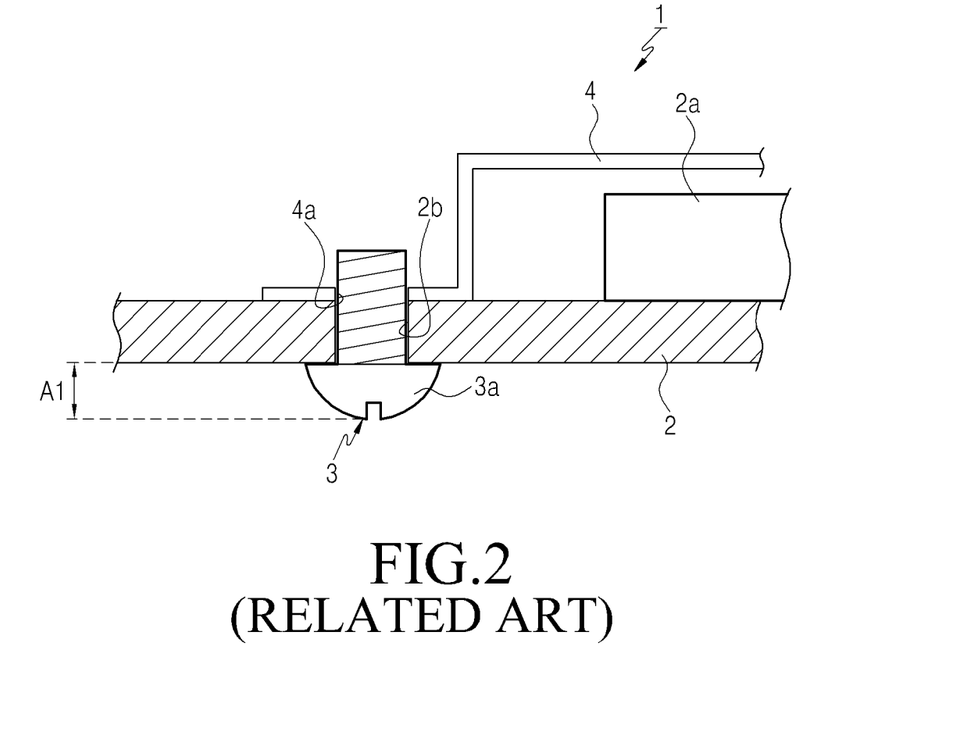
FIG. 2 is a side view showing an operation of a shielding apparatus employing a screw fastening structure according to the related art.

FIG. 1 is an exploded perspective view showing a configuration of a shielding apparatus employing a screw fastening structure according to the related art; and FIG. 2 is a side view showing an operation of the shielding apparatus employing a screw fastening structure according to the related art.

Referring to FIGS. 1 and 2, a screw fastening structure of the shielding apparatus 1 according to the related art includes a printed circuit board 2 provided with an electronic component 2a, a plurality of screw holes 2b provided on the printed circuit board 2, and a shield member 4 having a plurality of fastening holes 4a corresponding to the screw holes 2b.

As shown in FIG. 1, after the fastening holes 4a of the shield member 4 are aligned with the screw holes 2b, screws 3 are fastened to the holes 4a and 2b to fix the shield member 4 to the printed circuit board 2.

However, as shown in FIG. 2, since the shielding apparatus 1 fixed through the related-art screw structure has a structure in which heads 3a of the screws 3 protrude from a surface of the printed circuit board 2, a space A1 for the heads 3a of the screws 3 is necessary when the shield member 4 is assembled. Accordingly, volumes of the shield member 4 and the printed circuit board 2 increase, and assembly time and manufacturing costs increase as the screws 3 should be fastened to fix the shield member 4 to the printed circuit board 2.

Figure 3:
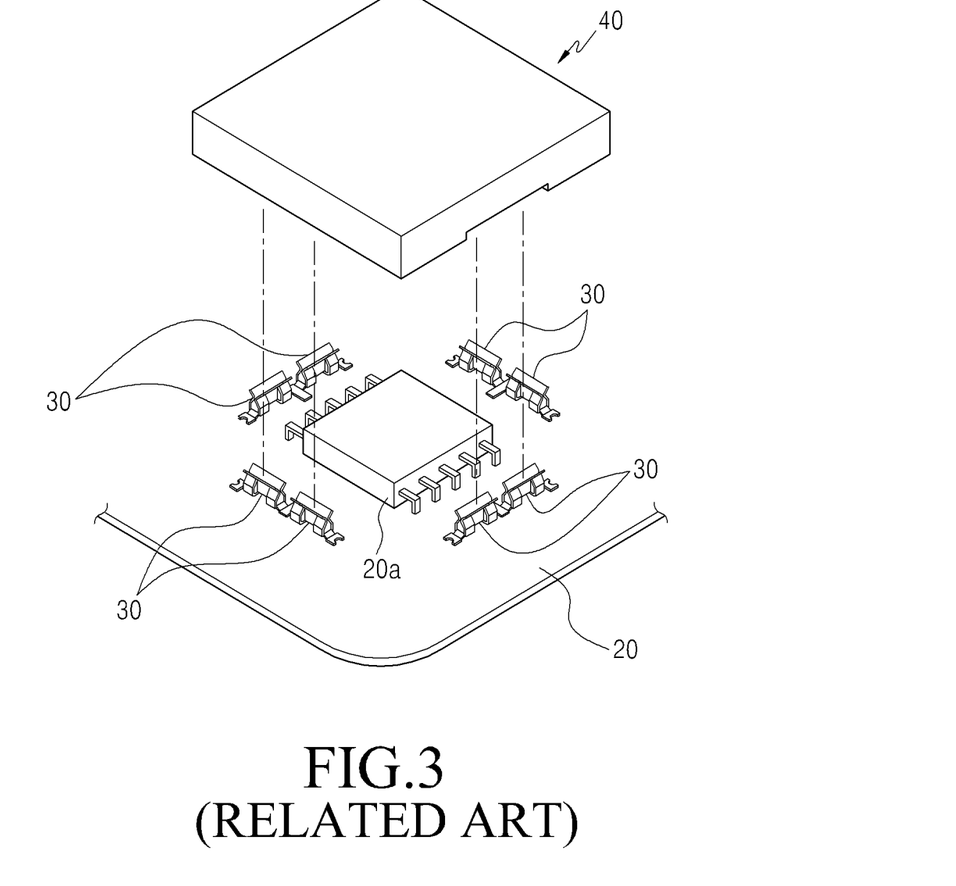
FIG. 3 is an exploded perspective view showing a configuration of a shielding apparatus employing a clip structure according to the related art.

FIG. 3 is an exploded perspective view showing a configuration of a shielding apparatus employing a clip structure according to the related art.

Referring to FIG. 3, a shielding apparatus employing a clip fastening method according to the related art includes a printed circuit board 20 provided with an electronic component 20a, a plurality of fixing clips 30 provided on the printed circuit board 20, and a shield member 40 fastened and fixed to the fixing clips 30.

However, the related-art fixing clips are mounted to the printed circuit board in a Surface Mounted Device (SMD) type to provide the shield member. Thus, the fixing clips increase assembly time and manufacturing costs due to the SMD process.

Further, since the related-art fixing clips have structures mounted to the printed circuit board through soldering, strengths thereof are weak after they are mounted to the printed circuit board and it is difficult to expand a ground of the printed circuit board. In addition, since outermost portions of the shield member are inserted into the fixing clips, it is difficult to expand the shield member to an area other than a specific area requiring shielding. That is, since additional fixing clips should be installed in an area other than the areas using the shield member through soldering and the shield member should be processed additionally, it is still more difficult to extend the shield member.

Thus, an apparatus for fastening or separating the shield member to and from the printed circuit board without protrusion of the shield member when the shield member is fastened to the printed circuit board and conveniently extending the shield member from the printed circuit board is required.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a shielding apparatus that includes at least one shield fastening part for fastening or separating a shield member from a printed circuit board with a resilient force when the shield member is fastened to the printed circuit board while not protruding from the printed circuit board, so that the shield member can be fastened or separated without using a related-art screw or clip and an assembly process thereof can be simplified by reducing the number of fastening components, making it possible to reduce assembly process time and manufacturing costs.

Another aspect of the present disclosure is to provide a shielding apparatus that includes a shield fastening part while the shield fastening part does not protrude from a printed circuit board, so that a component mounting space in the printed circuit board can be secured and a space can be efficiently utilized, and the sizes and volumes of products (for example, electronic devices) forming the printed circuit board can be made small or slim.

Another aspect of the present disclosure is to provide a shielding apparatus that has a catching part having an inclined catching hole fastened to a shield fastening part of a shield member in a printed circuit board to be conveniently fastened to or separated from the shield fastening part, and in which the catching part is formed of a metal material to additionally expand the ground of the printed circuit board.

Another aspect of the present disclosure is to provide a shielding apparatus in which a shield member is formed by fastening a shield fastening part to a catching part having an inclined catching hole formed in a printed circuit board so that an assembly process can be conveniently performed without a soldering process needed when a related-art fixing clip is mounted to the printed circuit board, a fastening force and a strength of the shield member can be enhanced, and the shield member can be expanded to areas other than a specific area requiring a shield.

Another aspect of the present disclosure is to provide a shielding apparatus that includes a fastening releasing part for releasing a shield fastening part fastened to a shield member to allow the shield member to be easily separated from a printed circuit board.

In accordance with an aspect of the present disclosure, a shielding apparatus is provided. The shielding apparatus includes a printed circuit board including a plurality of catching parts, a shield member configured to cover the printed circuit board, and at least one shield fastening part provided in the shield member and configured to be one of fastened to and separated from the plurality of catching parts by a resilient force while not protruding.

In accordance with a first embodiment of the present disclosure, a shielding apparatus is provided. The shielding apparatus includes a printed circuit board including a plurality of catching parts, a shield member configured to cover the printed circuit board, and at least one shield fastening part provided in the shield member that is configured to be prevented from protruding from the plurality of catching parts when being one of fastened to and separated from the plurality of catching parts.

In accordance with a second embodiment of the present disclosure, a shielding apparatus is provided. The shielding apparatus includes a printed circuit board including a plurality of catching parts, a shield member configured to cover the printed circuit board, and at least one shield fastening part provided at an inside of the shield member that is configured to be prevented from protruding from the plurality of catching parts when being one of fastened to and separated from the plurality of catching parts.

In accordance with a third embodiment of the present disclosure, a shielding apparatus is provided. The shielding apparatus includes a printed circuit board including a plurality of catching parts, a shield member configured to cover the printed circuit board, and at least one shield fastening part provided on an outside and an inside of the shield member that is configured to be prevented from protruding from the plurality of catching parts when being one of fastened to and separated from the plurality of catching parts.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

The same reference numerals are used to represent the same elements throughout the drawings.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalent.

It is to be understood that the singular forms "a," "an," and "the" include plural referents unless the context clearly dictates otherwise. Thus, for example, reference to "a component surface" includes reference to one or more of such surfaces.

Figure 4:
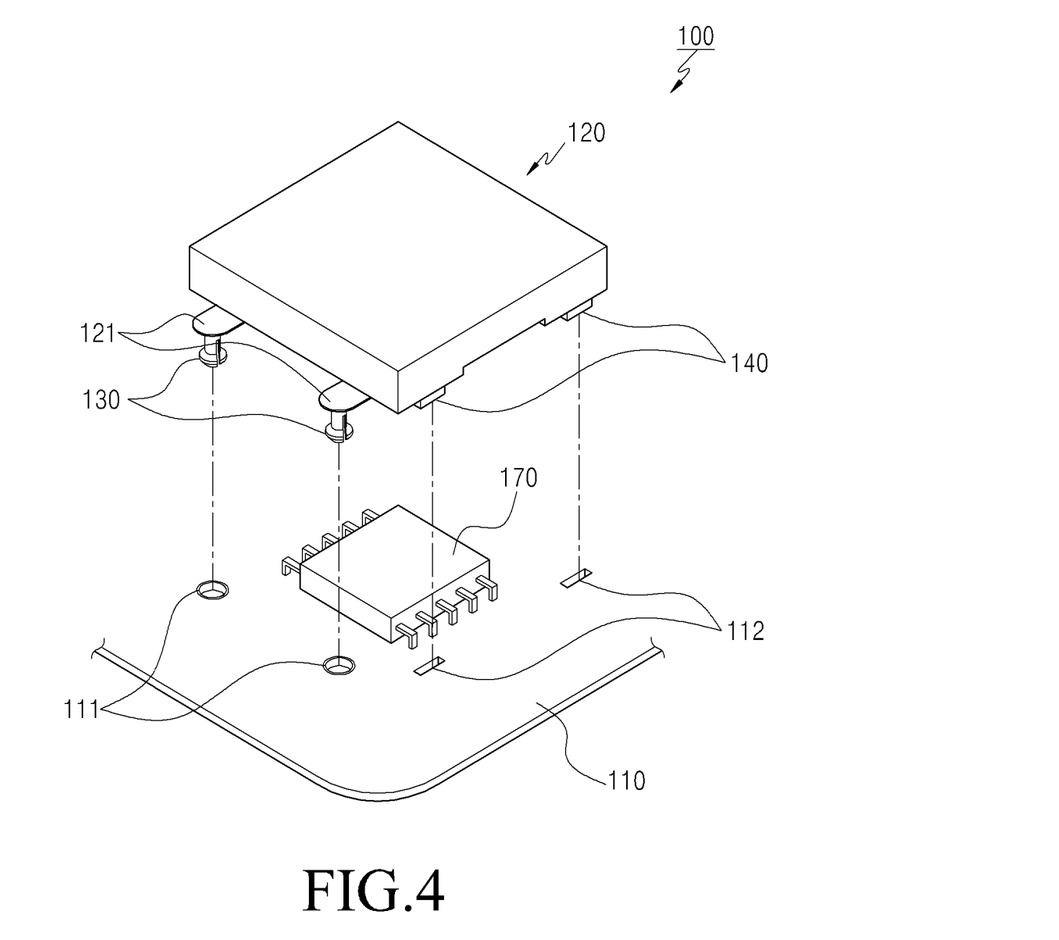
FIG. 4 is an exploded perspective view showing a configuration of a shielding apparatus according to a first embodiment of the present disclosure.
Figure 5:
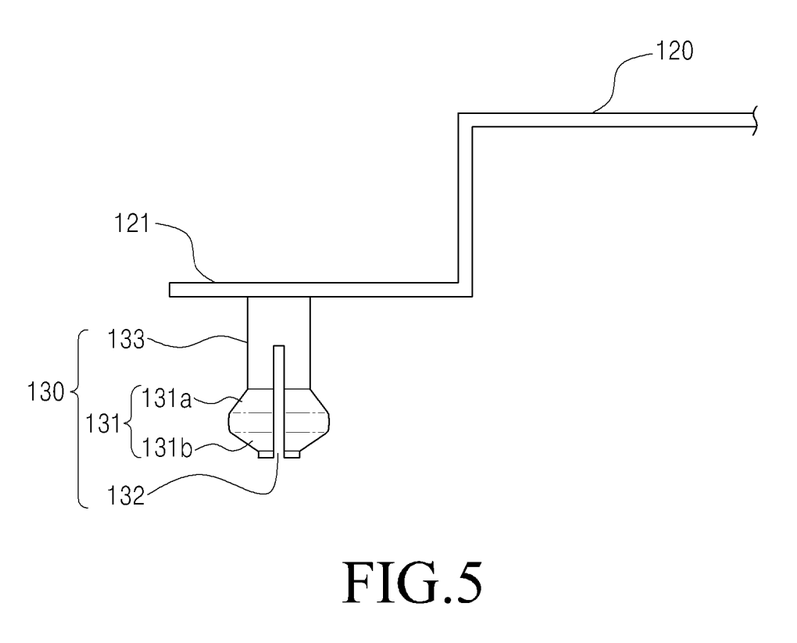
FIG. 5 is a side view showing a configuration of a shielding apparatus according to the first embodiment of the present disclosure.

FIG. 4 is an exploded perspective view showing a configuration of a shielding apparatus according to a first embodiment of the present disclosure. FIG. 5 is a side view showing the configuration of the shielding apparatus according to the first embodiment of the present disclosure.

Referring to FIGS. 4 and 5, first, the shielding apparatus 100 according to the first embodiment of the present disclosure includes a printed circuit board 110 provided in an electronic device (not shown), a shield member 120 covering the printed circuit board 110, and at least one shield fastening part 130. A plurality of catching parts 111 having inclined catching holes to be fastened to or separated from the shield fastening part 130 may be provided in the printed circuit board 110. The shield member 120 covers an upper surface of the printed circuit board 110 to interrupt an Electro-Magnetic Interference (EMI) phenomenon generated from electronic device components provided in the printed circuit board 110. The shield fastening parts 130 are provided in the shield member 120 to be fastened to or separated from the catching parts 111 by a resilient force, and to be prevented from protruding from the catching parts 111 at the same time. That is, the shield fastening parts 130 are fastened from the catching parts 111 of the printed circuit board 110 while not protruding.

Here, the shield member 120 may be a shield can or a bracket. Although a shield can or a bracket is exemplified as the shield member 120 in the embodiment of the present disclosure, the present disclosure is not limited thereto. That is, any configuration which can interrupt an EMI phenomenon of the electronic device components 170 may be applied as various modifications of the shield member 120.

Examples of the electronic device according to various embodiments of the present disclosure include all information communication devices and multimedia devices such as a Portable Multimedia Player (PMP), a digital audio player, a navigation device, a gaming device, a notebook, an advertising panel, a TeleVision (TV), a digital broadcasting player, a Persona Digital Assistant (PDA), and a smart phone and application device thereof, including all mobile communication terminals operated based on communication protocols corresponding to various communication systems.

In particular, in the various embodiment of the present disclosure, since the shield fastening parts 130 are fastened to or separated from a surface of the printed circuit board 110 while not protruding, the shied member 120 can be fastened and separated without using a related-art screw or clip, and an assembly process thereof can be simplified by reducing the number of shield fastening parts 130 as well. Accordingly, assembly time and manufacturing costs can be reduced, and space for mounting components 170 in the printed circuit board 110 can be secured and utilized more usefully.

In more detail, each of the catching parts 111 may have an inclined catching hole or a curved catching hole which is widened from an upper side toward a lower side to be easily fastened to or separated from the shield fastening part 130. In addition, a thickness of an upper portion of the catching part 111 is made larger than a thickness of a lower portion of the catching part 111 to prevent damage to the catching part 111 due to a contact thereof when the catching part 111 is fastened to the shield fastening part 130. Thus, an upper portion of the catching part 111 increases a strength thereof while preventing the catching part 111 from being easily damaged.

Figure 7:
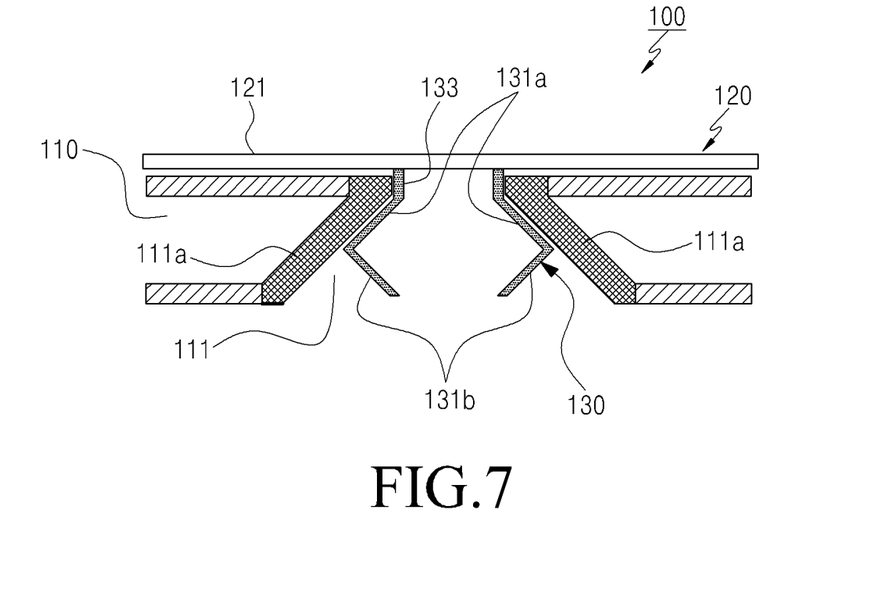
FIG. 7 is a side sectional view showing a catching part formed by expanding a ground of a configuration of a shielding apparatus according to the first embodiment of the present disclosure.
Figure 8:
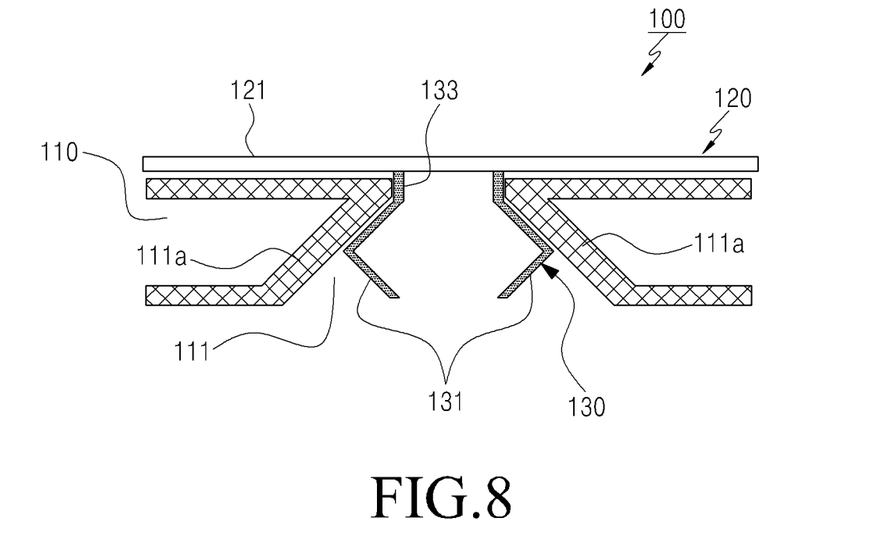
FIG. 8 is a side sectional view showing another example of catching parts formed of an insulating material according to the first embodiment of the present disclosure.

FIG. 7 is a side sectional view showing configurations of the catching parts 111 according to the first embodiment of the present disclosure, and FIG. 8 is a side sectional view showing another example of the catching parts 111 according to the first embodiment of the present disclosure.

Referring to FIG. 7, the inclined surfaces 111a of the catching parts 111 may be formed of a metal material to expand a ground of the printed circuit board 110. Referring to FIG. 8, the inclined surfaces 111a of the catching parts 111 may be formed of or coated with an insulating material.

At least one coupling part 121 is provided at an outer circumference of the shield member 120 to include the shield fastening parts 130.

In particular, the shield fastening parts 130 may be any one of spring fasteners and plate springs. Other types of springs as well as spring fasteners and plate springs may be applied to the shield fastening parts 130. In the embodiment of the present disclosure, spring fasteners will be exemplified.

Meanwhile, as shown in FIG. 5, the shield fastening part 130 includes a fastening head 131, a resilient space 132, and a support 133. The fastening head 131 is provided at one end of the shield fastening part 130, and is contracted or expanded to be fastened to or separated from the catching part 111. The resilient space 132 is formed at a center of the fastening head 131 so that the fastening head 131 can be contracted or expanded. The support 133 connects the shield member 120 and the fastening head 131 while supporting them.

In addition, the fastening head 131 may have a rhombic or circular shape. Here, the fastening head 131 is not limited to a rhombic or circular shape. For example, the fastening head 131 may have a triangular, polygonal, or elliptical shape. In the embodiment of the present disclosure, the fastening heads 131 may have shapes of "  ".

Here, the fastening head 131 will be described in more detail as follows. First, as shown in FIG. 5, the fastening head 131 includes an inclined contact portion 131a and an inclined insertion portion 131b. The inclined contact portion 131a is caught by the inclined catching hole 111 while contacting the inclined catching hole 111. The inclined insertion portion 131b is formed at one end of the fastening head 131 to be inserted into the inclined catching hole 111. That is, the inclined insertion portions 131b become close to each other to be inserted into the inclined catching hole 111.

An inclination angle between the inclined contact portion 131a and the inclined insertion portion 131b may be 60 to 120 degrees. A specific inclination angle between the inclined contact portion 131a and the inclined insertion portion 131b may be 90 degrees.

As shown in FIG. 4, at least one guide rib 140 is formed in the shield member 120 to be coupled to at least one guide groove 112 formed in the printed circuit board 110 and stably fix the shield member 120 to the printed circuit board 110 at the same time.

Meanwhile, another example of the fastening head 150 included in the shield fastening part 130 will be described below in more detail with reference to the following drawings.

Figure 9A:
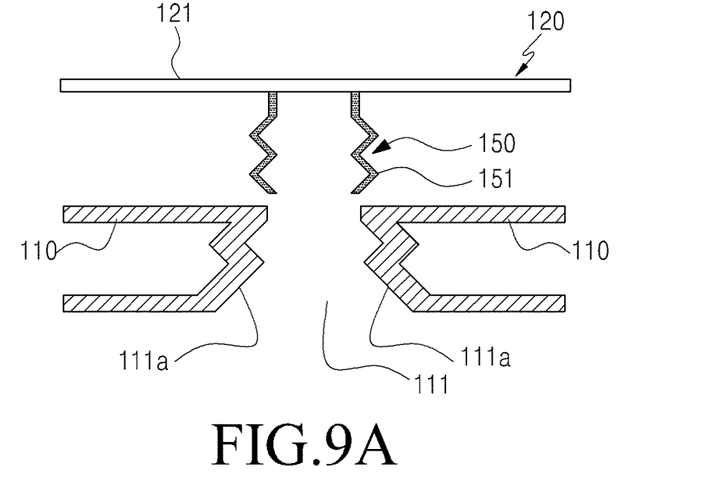
FIG. 9A is a side sectional view showing a state before coupling of another example of a fastening head of a shield fastening part according to the first embodiment of the present disclosure.
Figure 9B:
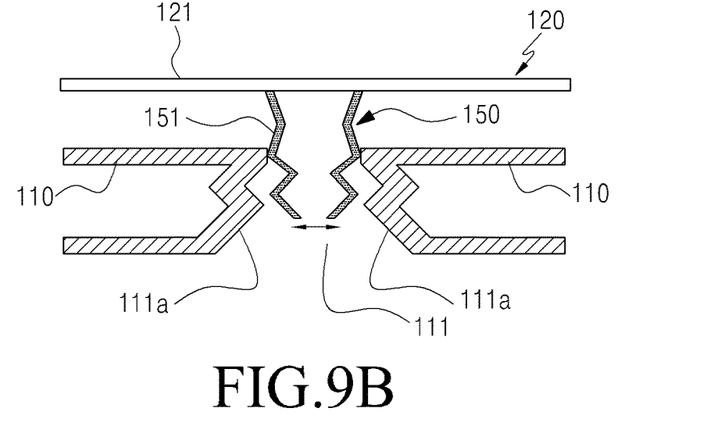
FIG. 9B is a side sectional view showing a coupling process of another example of a fastening head according to the first embodiment of the present disclosure.
Figure 9C:
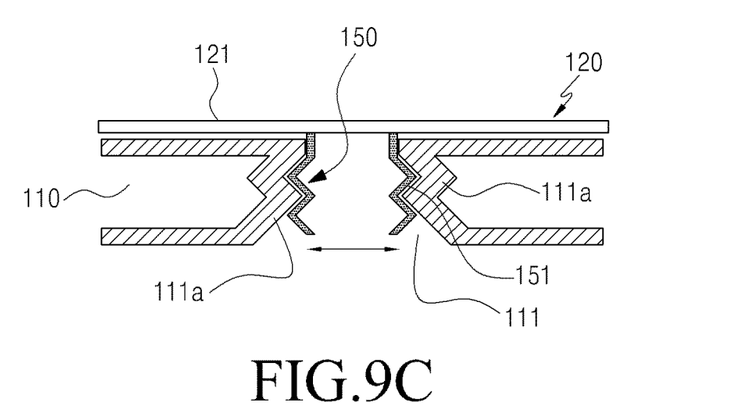
FIG. 9C is a side sectional view showing a coupled state of another example of a fastening head according to the first embodiment of the present disclosure.

FIG. 9A is a side sectional view showing a state before coupling of another example of the fastening head 150 according to the first embodiment of the present disclosure. FIG. 9B is a side sectional view showing a coupling process of the other example of the fastening head 150 according to the first embodiment of the present disclosure. FIG. 9C is a side sectional view showing a coupled state of the other example of the fastening head 150 according to the first embodiment of the present disclosure.

Referring to FIG. 9A, the fastening head 150 has a multi-stepped fastening portion 151 to be fastened to or separated from a plurality of inclined surfaces 111a formed in the catching part 111 in multi-steps. In the embodiment of the present disclosure, the fastening heads 150 may have shapes of "  ".

Referring to FIG. 9B, when the fastening heads 131 are inserted between the catching parts 111, the multi-stepped fastening portions 151 become close to each other to be contracted at the same time, and are inserted between the catching parts 111. Referring to FIG. 9C, the contracted fastened heads 150 are inserted between the catching parts 111 to be expanded at the same time so that the multi-stepped fastening portions 151 of the fastening heads 150 are fastened to the plurality of inclined surfaces 111a of the catching parts 111 in multi-steps.

Thus, since the fastening heads 150 are fastened to the catching parts 111 in multi-steps, a fastening force between the shield member 120 and the printed circuit board 110 can be further improved.

An example of another embodiment of the fastening heads 130b provided in the shield fastening part 130 will be described below in more detail with reference to the following drawings.

Figure 10A:
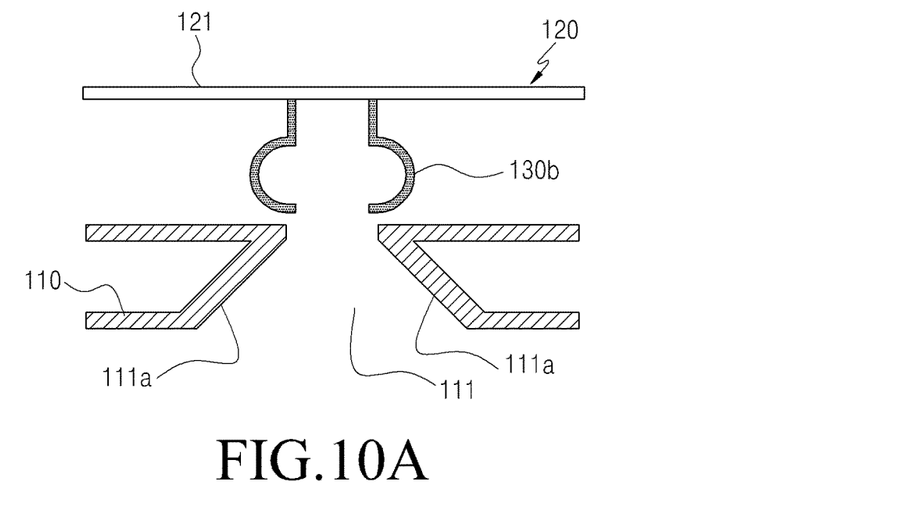
FIG. 10A is a side sectional view showing a state before coupling of another example of fastening heads of a shield fastening part according to the first embodiment of the present disclosure.
Figure 10B:
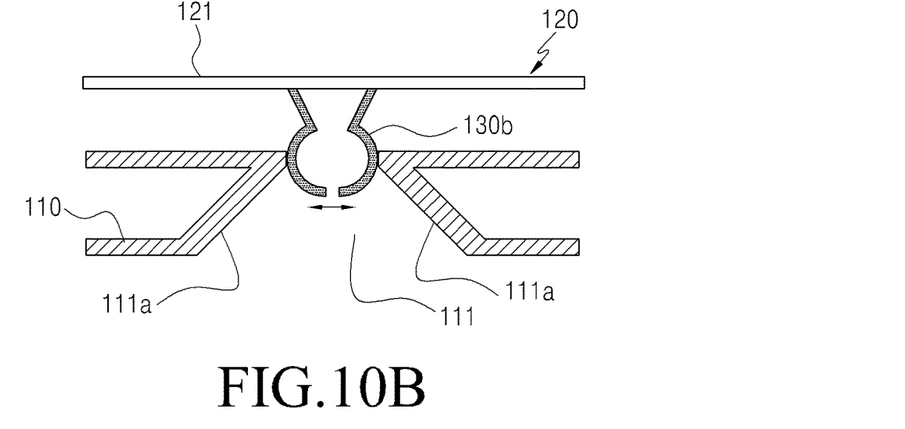
FIG. 10B is a side sectional view showing a fastening process of another example of a fastening head according to the first embodiment of the present disclosure.
Figure 10C:
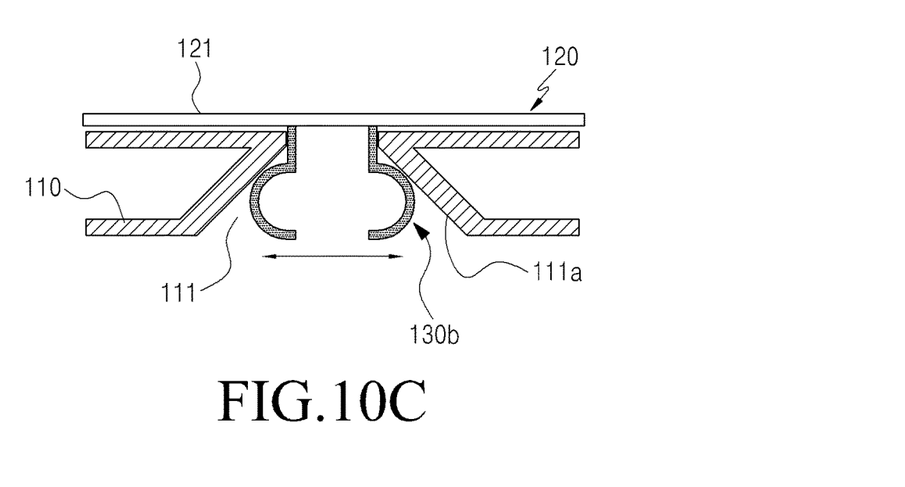
FIG. 10C is a side sectional view showing a fastened state of a fastening head according to another example of the first embodiment of the present disclosure.

FIG. 10A is a side sectional view showing a state before coupling of another example of the fastening heads 130 according to the first embodiment of the present disclosure. FIG. 10B is a side sectional view showing a fastening process of the other example of the fastening head 130b according to the first embodiment of the present disclosure. FIG. 10C is a side sectional view showing a fastened state of the other example of the fastening head 131 according to the first embodiment of the present disclosure.

Referring to FIG. 10A, the fastening heads 130b have circular shapes to be fastened to or separated from the inclined surfaces 111a formed in the catching parts 111. In the embodiment of the present disclosure, the fastening heads 130b may have shape of "  ".

Referring to FIG. 10B, when the fastening heads 130b are inserted between the catching parts 111, the circular fastening heads 130b become close to each other to be contracted, and are inserted between the catching parts 111. Referring to FIG. 10C, the contracted circular fastening heads 130b are inserted between the catching parts 111 to be expanded, and are caught by the inclined surfaces 111a of the catching parts 111 to be fastened.

Thus, since the fastening heads 130b are fastened to the catching parts 111, a fastening force between the shield member 120 and the printed circuit board 110 can be further improved.

Further, the catching parts 111 may have the inclined surfaces 111a. Although the inclined surfaces 111a are exemplified as the catching parts 111, the present disclosure is not limited thereto. That is, a configuration having another shape to contact the fastening heads 130b having a circular shape may be applied to the catching parts 111. For example, the catching parts 111 may have semispherical shapes to be fitted with the fastening heads 131 having a circular shape.

Meanwhile, a fastening releasing part 160 of the shielding apparatus will be described below in more detail with reference to the following drawings.

Figure 11A:
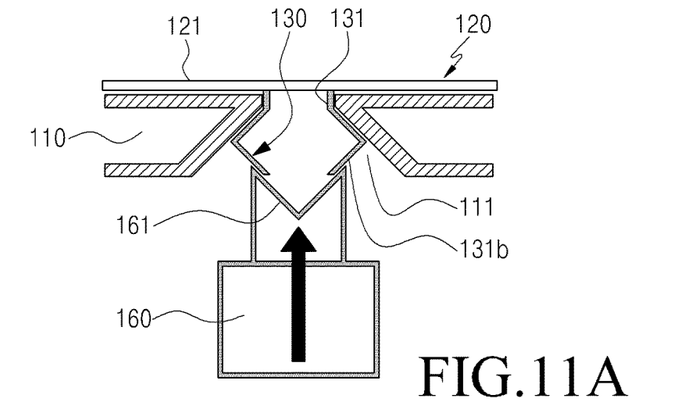
FIG. 11A is a side sectional view showing a state before an operation of a fastening releasing part according to the first embodiment of the present disclosure.
Figure 11B:
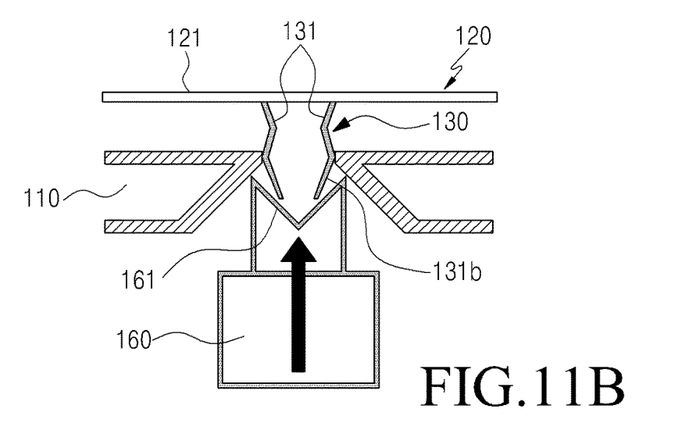
FIG. 11B is a side sectional view showing an operation process of a fastening releasing part according to the first embodiment of the present disclosure.
Figure 11C:
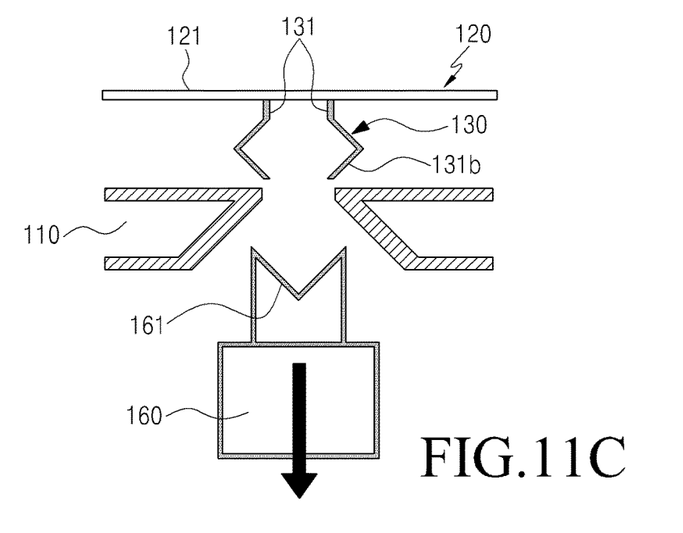
FIG. 11C is a side sectional view showing a state after an operation of a fastening releasing part according to the first embodiment of the present disclosure.

FIG. 11A is a side sectional view showing a state before an operation of a fastening releasing part 160 according to the first embodiment of the present disclosure. FIG. 11B is a side sectional view showing an operation process of the fastening releasing part 160 according to the first embodiment of the present disclosure. FIG. 11C is a side sectional view showing a state after an operation of the fastening releasing part 160 according to the first embodiment of the present disclosure.

Referring to FIG. 11A, the shielding apparatus 100 includes a fastening releasing part 160 to release the fastening of the shield fastening parts 130 while the shield fastening parts 130 are fastened to the catching parts 111 of the printed circuit board 110.

An inclined contraction recess 161 is formed at an upper portion of the fastening releasing part 160 to be coupled to the fastening heads 131 provided in the shield fastening parts 130 so that the fastening heads 131 become close to each other to be contracted.

In this way, in order to separate the shield fastening parts 130 caught by and fastened to the catching parts 111 of the printed circuit board 110, the contraction recess 161 of the fastening releasing part 160 is brought into contact with the fastening heads 131.

Referring to FIG. 11B, if the fastening releasing part 160 is pushed upward, the inclined insertion portions 131b provided in the fastening heads 131 are inserted into the contraction recess 161 to become close to each other and the fastening heads 131 of the shield fastening parts 130 are contracted to be pointed. Referring to FIG. 11C, the fastening heads 131 become close to each other and a gap between them becomes thin, and if the fastening releasing parts 160 are further pushed by a tool, the fastening heads 131 are separated from the catching parts 111 and the fastening of the fastening heads 131 are released.

Thus, the shield fastening parts 130 can be conveniently separated from the catching parts 111 by the fastening releasing part 160.

Here, a process of fastening the shielding apparatus according to the embodiment of the present disclosure will be described below in more detail.

Figure 6A:
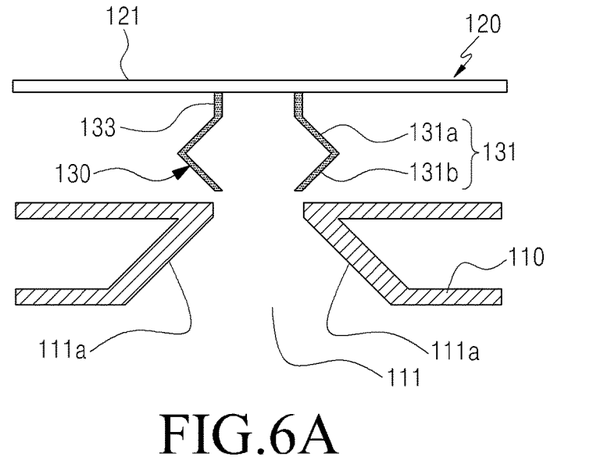
FIG. 6A is a side sectional view showing a state before coupling of a shielding apparatus according to the first embodiment of the present disclosure.
Figure 6B:
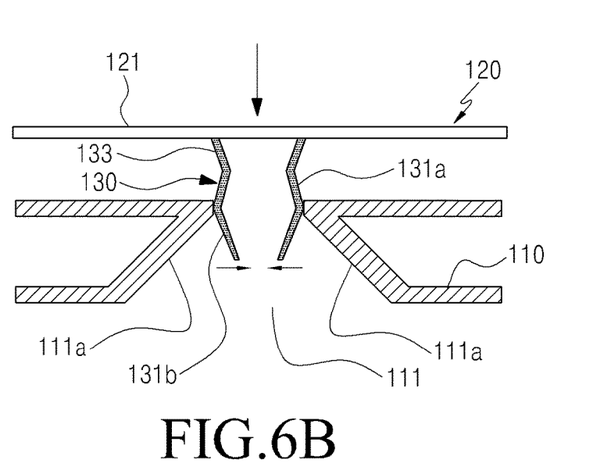
FIG. 6B is a side sectional view showing a process of coupling a shielding apparatus according to the first embodiment of the present disclosure.
Figure 6C:
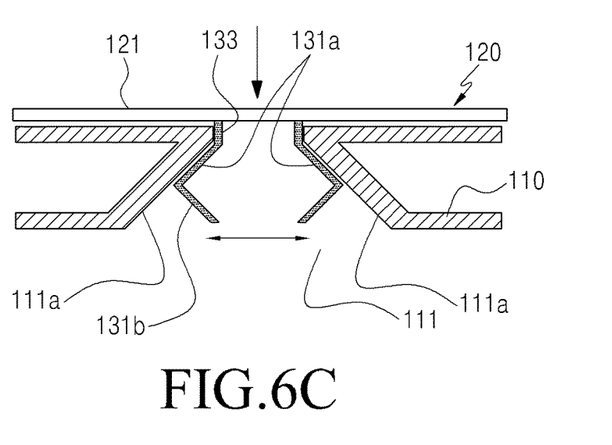
FIG. 6C is a side sectional view showing a state after coupling of a shielding apparatus according to the first embodiment of the present disclosure.

FIG. 6A is a side sectional view showing a state before fastening of the shielding apparatus according to the present disclosure. FIG. 6B is a side sectional view showing a process of fastening the shielding apparatus according to the present disclosure. FIG. 6C is a side sectional view showing a state after coupling of the shielding apparatus according to the present disclosure.

Referring once again to FIG. 4, components 170 of an electronic device are mounted to a surface of the printed circuit board 110 in an SMD type, and a plurality of catching parts 111 having inclined catching holes are formed in the printed circuit board 110. Here, inner sides of the inclined catching holes may be formed of a metal material so that a ground of the printed circuit board 110 can be extended.

In this state, the shield member 120 covers an outer circumference of the electronic device components 170 provided in the printed circuit board 110.

Referring to FIG. 6A, the shield fastening parts 130 provided in the shield member 120 are inserted into an entrance formed by the catching parts 111. That is, the shield heads 131 of the shield fastening parts 130 are inserted into an entrance formed by the catching parts 111. Since a resilient space 132 is formed at a center of the fastening heads 131 to be contracted or expanded by a resilient force, the resilient space 132 is contracted to become narrow when the fastening heads 131 contact the entrance of the catching parts 111 having the inclined catching holes.

In particular, since the inclined insertion portions 131b are formed at ends of the fastening heads 131 to be inserted into the inclined catching holes 111, the inclined insertion portions 131b are inserted into the entrances of the catching holes 111.

Referring to FIG. 6B, the inclined insertion portions 131b of the fastening heads 131 become close to each other and a width between them becomes narrow, and a shape of the fastening heads 131 becomes pointed. In this state, if the shield member 120 is further pushed, referring to FIG. 6C, the fastening heads 131 pass between the catching parts 111 and are expanded between the catching parts 111 to be widened, and the inclined contact portions 131a of the fastening heads 131 are brought into contact with the inner inclined surfaces 111b of the inclined catching holes 111. Then, the fastening heads 131 are caught by the catching parts 111 to be fastened.

Thus, if the fastening heads 131 are fastened to the catching parts 111, the shield fastening parts 130 are fastened and fixed to the printed circuit board 110. Then, since at least one guide rib 140 is formed on a surface of a lower end of the shield member 120, the guide ribs 140 are inserted into and coupled to at least one guide groove 112 formed in the printed circuit board 110 to stably fasten and fix the shield member 120 to the printed circuit board 110 when the shield member 120 covers the printed circuit board 110.

Accordingly, since the shield fastening parts 130 are fixed to the printed circuit board 110 while not protruding, screws and clips protruding from the existing printed circuit board 110 are not necessary, and a space for mounting a component 170 in the printed circuit board 110 can be secured.

Hereinafter, a shielding apparatus according to a second embodiment of the present disclosure will be described with reference to FIG. 12.

Figure 12:
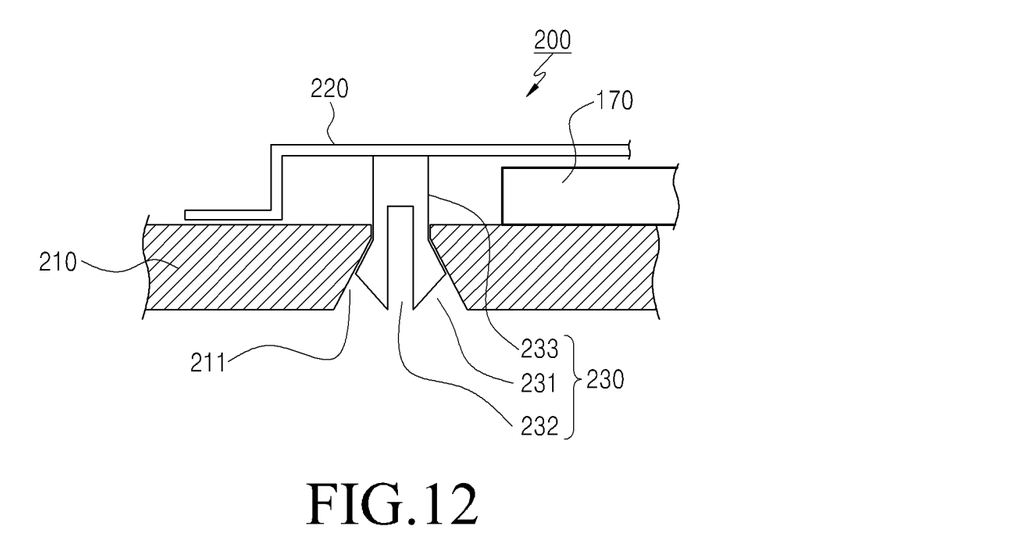
FIG. 12 is a side sectional view showing a configuration of a shielding apparatus according to a second embodiment of the present disclosure.

FIG. 12 is a side sectional view showing a configuration of a shielding apparatus according to a second embodiment of the present disclosure.

Referring to FIG. 12, first, the shielding apparatus 200 includes a printed circuit board 210 provided in an electronic device (not shown), a shield member 220 covering the printed circuit board 210, and at least one shield fastening part 230. A plurality of catching parts 211 having inclined catching holes to be fastened to or separated from the shield fastening part 230, which will be described below, may be provided in the printed circuit board 210. The shield member 220 covers an upper surface of the printed circuit board 210 to interrupt the EMI phenomenon generated from electronic device components 170 provided on the printed circuit board 210. The shield fastening parts 230 are provided inside the shield member 220 to be fastened to or separated from the catching parts 211 by a resilient force and to prevent the shield fastening parts 230 from protruding from the catching parts 211. That is, the shield fastening parts 230 and the catching parts 211 of the printed circuit board 210 are located in the shield member 220, and the shield fastening parts 230 are fastened to the catching parts 211 while not protruding.

Meanwhile, as shown in FIG. 12, the shield fastening part 230 includes a fastening head 231, a resilient space 232, and a support 233. The fastening head 231 is provided at an end of the shield fastening parts 230 to be contracted or expanded so as to be fastened to or separated from the catching parts 211. The resilient space 232 is formed at a center of the fastening head 231 so that the fastening head 231 is contracted or expanded. The support 233 connects an inside of the shield member 220 and the fastening head 231 to support them.

The length of the support 233 is formed to be the same as the thickness of a side surface of the shield member 220 so that the shield fastening part 230 is provided inside the shield member 220.

Here, a shape and an angle of the fastening head 231 is the same as in the first embodiment of the present disclosure, and thus a description will be omitted herein.

A process of fastening the shielding apparatus 200 according to the embodiment of the present disclosure will be described below in more detail.

First, as shown in FIG. 12, the shield member 220 covers an outer circumference of the electronic device component 170 provided in the printed circuit board 210.

Then, the shield fastening part 230 provided inside the shield member 220 is inserted into an entrance formed by the catching parts 211. That is, the fastening head 231 is inserted into the entrance of the catching parts 211 first. Since a resilient space 232 is formed at a center of the fastening head 231 to be contracted or expanded by a resilient force, the resilient space 232 becomes narrow when the fastening head 231 contacts the entrance of the catching parts 211.

In particular, since the inclined insertion portion is formed at one end of the fastening head 231 to be inserted between the catching parts 211, the inclined insertion portion is inserted into the entrance of the catching parts 211.

That is, the inclined insertion portions of the fastening head 231 become close to each other and a width between them becomes narrow, and a shape of the fastening head 231 is formed to be pointed. In this state, if the shield member 220 is further pushed, the fastening head 231 passes between the catching parts 211 and is expanded between the catching parts 211, and a width thereof becomes wide, so that the inclined contact portions of the fastening head 231 contact insides of the catching parts 211. Then, the fastening head 231 is caught by the catching parts 211 to be fastened.

Thus, if the fastening head 231 is fastened to the catching parts 211, the shield fastening part 230 having the fastening head 231 is fastened and fixed to the printed circuit board 210.

Accordingly, the shield fastening part 230 is fixed to the printed circuit board 210 while not protruding, and the shield member 220 is also fixed to the printed circuit board 210.

Here, when fastening of the shield fastening part 230 fastened to the printed circuit board 210 is released, fastening of the shield fastening part 230 is released from the printed circuit board 210 by using the fastening releasing part 160 (see FIG. 11A). Here, the fastening releasing part 160 is the same as in the first embodiment of the present disclosure, and thus a description thereof will be omitted herein.

Figure 13:
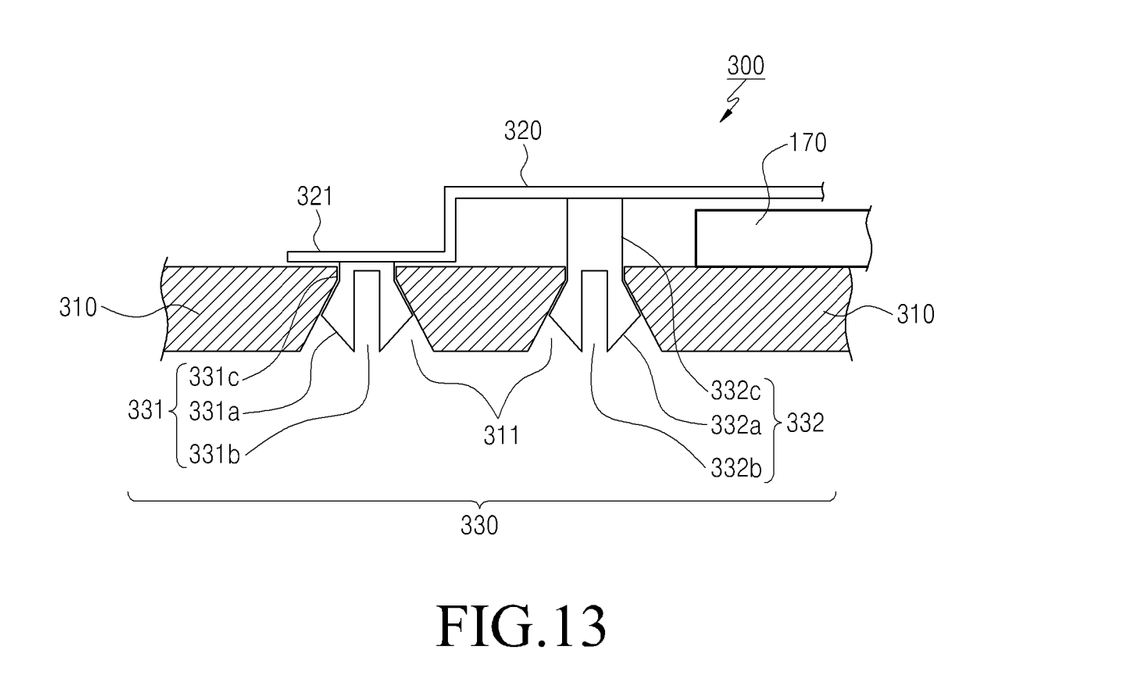
FIG. 13 is a side sectional view showing a configuration of a shielding apparatus according to a third embodiment of the present disclosure.

FIG. 13 is a side sectional view showing a configuration of a shielding apparatus according to a third embodiment of the present disclosure.

A configuration of the shielding apparatus 300 according to the third embodiment of the present disclosure will be described with reference to FIG. 13. First, the shielding apparatus 300 includes a printed circuit board 310 provided with a plurality of catching parts 311 having inclined catching holes, a shield member 320 covering the printed circuit board 310, and at least one shield fastening part 330. The shield fastening parts 330 are provided inside the shield member 320 to be fastened to or separated from the catching parts 311 by a resilient force and to prevent the shield fastening part 330 from protruding from the catching parts 311. That is, the shield fastening part 330 includes first and second shield fastening parts 331 and 332. The first shield fastening part 331 is provided at a coupling part 321 provided at an outer circumference of the shield member 320 and the second shield fastening part 330 is provided inside the shield member 320.

The first and second shield fastening parts 331 and 332 are fastened to the catching parts 311 formed in the printed circuit board 310 while not protruding.

Meanwhile, in a more detailed description of the first and second shield fastening parts 331 and 332, first, as shown in FIG. 13, the first shield fastening part 331 includes a first fastening head 331*a*, a first resilient space 331*b*, and a first support 331*c*. The first fastening head 331*a* is provided at one end of the first shield fastening part 331 to be contracted or expanded so as to be fastened to or separated from the catching parts 311. The first resilient space 331*b* is formed at a center of the first fastening head 331*a* so that the first fastening head 331*a* is contracted or expanded. The first support 331*c* connects the coupling part 321 provided in the shield member 320 and the first fastening head 331*a* to support them.

The second shield fastening part 332 includes a second fastening head 332*a*, a second resilient space 332*b*, and a second support 332*c*. The second fastening head 332*a* is provided at one end of the second shield fastening part 332 to be contracted or expanded so as to be fastened to or separated from the catching parts 311 located inside the shield member 320. The second resilient space 332*b* is formed at a center of the second fastening head 332*a* to be contracted or expanded. The second support 332*c* connects an inside of the shield member 320 and the second fastening head 332*a* to support them.

The second support 332*c* of the second shield fastening part 332 is formed to be longer than the first support 331*c* of the first shield fastening part 331 so as to be provided inside the shield member 320.

Here, shapes and angles of the first and second fastening heads 331*a* and 332*a* are the same as in the first embodiment of the present disclosure, and thus a description thereof will be omitted herein.

Hereinafter, a process of fastening the shielding apparatus 300 according to the embodiment of the present disclosure will be described in more detail.

First, as shown in FIG. 13, the shield member 320 covers an outer circumference of the electronic device component 170 provided in the printed circuit board 310.

Then, the first and second shield fastening parts 331 and 332 provided at an outside and an inside of the shield member 320 are inserted into entrances of the catching parts 311 formed in the printed circuit board 310. That is, the first and second fastening heads 331*a* and 332*a* of the first and second shield fastening parts 331 and 332 are first inserted into the entrances of the catching parts 311. Since the first and second resilient spaces 331*b* and 332*b* are formed at centers of the first and second fastening heads 331*a* and 332*a* to be contracted or expanded by a resilient force, the first and second resilient spaces 331*b* and 332*b* are contracted to become narrow when the first and second fastening heads 331*a* and 332*a* contact the entrances of the catching parts 311.

In particular, since inclined insertion portions are formed at ends of the first and second fastening heads 331*a* and 332*a* to be inserted between the catching parts 311, the inclined insertion portions are inserted into the entrances of the catching holes.

That is, the inclined insertion portions of the first and second fastening heads 331*a* and 332*a* become close to each other and widths thereof become narrow, and shapes of the first and second fastening heads 331*a* and 332*a* are formed to be pointed. In this state, if the shield member 320 is further pushed, the first and second fastening heads 331*a* and 332*a* pass between the catching parts 311 to be expanded in the catching parts 311 and become wide. Then, the inclined contact portions of the first and second fastening heads 331*a* and 332*a* contact insides of the catching parts 311. The first and second fastening heads 331*a* and 332*a* are caught by the catching parts 311 to be fastened.

Thus, if the first and second fastening heads 331*a* and 332*a* are fastened to the catching parts 311, the first and second shield fastening parts 331 and 332 having the first and second fastening heads 331*a* and 332*a* are fastened and fixed to the printed circuit board 310.

Accordingly, the first and second shield fastening parts 331 and 332 are fixed to the printed circuit board 310 while not protruding, and the shield member 320 is fixed to the printed circuit board 310.

Here, when the fastening of the first and second shield fastening parts 331 and 332 fastened to the printed circuit board 310 are released, the fastening releasing part 160 (see FIG. 11A) is used. Here, a detailed description of the fastening releasing part 160 has been made in the first embodiment of the present disclosure, and thus will be omitted herein.

In this way, since the heads 3*a* of the screws 3 (see FIG. 1) and the clips 30 (see FIG. 3) protrude from a printed circuit board 2 (see FIG. 1) in the shield member using the related-art screws and clips, the space A1 (see FIG. 2) of the heads 3*a* of the screws 3 or a space for the clips 30 is necessary during assembly of the shield member 4. Accordingly, the volumes of the shield member 4 (see FIG. 1) and the printed circuit board 2 become large, and assembly process time and manufacturing costs increase as the screws 3 and the clips for fixing the shield member 4 to the printed circuit board 2 are mounted.

Thus, in the first, second, and third embodiments of the present disclosure, the shield member can be fastened to the printed circuit board without using screws and clips and can be prevented from protruding from the printed circuit board. In addition, assembly process time and manufactured costs can be reduced.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A shielding apparatus comprising:
a printed circuit board including at least one opening forming at least one inclined catching part;
at least one shield member configured to cover at least a portion of the printed circuit board; and
at least one shield fastening part provided in the at least one shield member,
wherein the at least one shield fastening part is configured to be resiliently deformed to fit in the at least one opening and fastened to the at least one inclined catching part by a resilient force released by the at least one shield fastening part while not protruding out of the printed circuit board.

2. The shielding apparatus of claim 1, wherein the at least one opening forming the at least one inclined catching part comprises an inclined catching hole.

3. The shielding apparatus of claim 1, wherein the at least one shield fastening part comprises at least one of a spring fastener or a plate spring.

4. The shielding apparatus of claim 1, wherein, to detach the at least one shield fastening part from the printed circuit, the at least one shield fastening part is resiliently deformed to detach from the at least one inclined catching part.

5. A shielding apparatus comprising:
a printed circuit board including at least one opening forming at least one inclined catching part;
at least one shield member configured to cover at least a portion of the printed circuit board; and
at least one shield fastening part provided in the at least one shield member,
wherein the at least one shield fastening part is configured to be positioned in the at least one opening and fastened to the at least one inclined catching part while not protruding out of the printed circuit board.

6. The shielding apparatus of claim 5,
wherein the at least one opening of the at least one inclined catching part comprises an inclined catching hole, and
wherein the inclined catching hole becomes narrower as the inclined catching hole extends from an upper side to a lower side of the printed circuit board.

7. The shielding apparatus of claim 5,
wherein the at least one inclined catching part comprises a catching hole, and
wherein the catching hole becomes one of a curved surface or a jagged surface as the catching hole extends from an upper side to a lower side of the printed circuit board.

8. The shielding apparatus of claim 5, wherein a thickness of an upper portion of the at least one inclined catching part is larger than a thickness of a lower portion thereof.

9. The shielding apparatus of claim 5, wherein an inclined surface of the at least one inclined catching part comprises metal and is electrically coupled to a ground.

10. The shielding apparatus of claim 5, wherein an inclined surface of the at least one inclined catching part comprises an insulating material.

11. The shielding apparatus of claim 5, further comprising:
at least one coupling part at an outer circumference of the at least one shield member,
wherein the at least one coupling part comprises the at least one shield fastening part.

12. The shielding apparatus of claim 5, wherein the at least one shield fastening part further comprises:
a fastening head,
a resilient space formed at a center of the fastening head, and
a support configured to connect the at least one shield member and the fastening head while supporting the at least one shield member and the fastening head.

13. The shielding apparatus of claim 12, wherein the fastening head comprises one of a rhombic shape and a circular shape.

14. The shielding apparatus of claim 12,
wherein the at least one opening of the at least one inclined catching part comprises an inclined catching hole, and
wherein the fastening head comprises:
an inclined contact portion configured to contact the inclined catching hole; and
an inclined insertion portion formed at one end of the fastening head and configured to be inserted into the inclined catching hole.

15. The shielding apparatus of claim 14, wherein an inclination angle between the inclined contact portion and the inclined insertion portion is about 60 to 120 degrees.

16. The shielding apparatus of claim 12, wherein the fastening head further comprises a multi-stepped fastening portion that is one of fastened to or separated from a plurality of inclined surfaces formed in the at least one inclined catching part in multi-steps.

17. The shielding apparatus of claim 5, wherein the at least one shield member includes at least one guide rib configured to fix the at least one shield member when being coupled to at least one guide groove formed in the printed circuit board.

18. The shielding apparatus of claim 5, further comprising:
a fastening releasing part configured to release the at least one shield fastening part when the at least one shield fastening part is fastened to the at least one inclined catching part.

19. The shielding apparatus of claim 18, further comprising:
an inclined contraction recess formed in the fastening releasing part,
wherein the inclined contraction recess is configured to contract when being coupled to the at least one shield fastening part.

20. The shielding apparatus of claim 5, wherein, to attach the at least one shield fastening part to the printed circuit, the at least one shield fastening part is configured to be resiliently deformed to fit through the at least one opening and fastened to the at least one inclined catching part by a resilient force released by the at least one shield fastening part.

21. The shielding apparatus of claim 5, wherein, to detach the at least one shield fastening part from the printed circuit, the at least one shield fastening part is resiliently deformed to detach from the at least one inclined catching part.

* * * * *